(12) United States Patent
Lee et al.

(10) Patent No.: US 12,176,041 B2
(45) Date of Patent: Dec. 24, 2024

(54) MEMORY DEVICE AND METHOD OF OPERATING THE MEMORY DEVICE

(71) Applicant: SK hynix Inc., Icheon-si Gyeonggi-do (KR)

(72) Inventors: Hye Lyoung Lee, Icheon-si Gyeonggi-do (KR); Tae Un Youn, Icheon-si Gyeonggi-do (KR); Kwang Min Lim, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 157 days.

(21) Appl. No.: 17/983,066

(22) Filed: Nov. 8, 2022

(65) Prior Publication Data

US 2023/0420056 A1     Dec. 28, 2023

(30) Foreign Application Priority Data

Jun. 28, 2022   (KR) ........................ 10-2022-0078879

(51) Int. Cl.
| | | |
|---|---|---|
| *G11C 16/16* | (2006.01) | |
| *G11C 16/04* | (2006.01) | |
| *G11C 16/08* | (2006.01) | |
| *G11C 16/32* | (2006.01) | |

(52) U.S. Cl.
CPC .......... *G11C 16/16* (2013.01); *G11C 16/0433* (2013.01); *G11C 16/08* (2013.01); *G11C 16/32* (2013.01)

(58) Field of Classification Search
CPC ..... G11C 16/16; G11C 16/0433; G11C 16/08; G11C 16/32; G11C 2216/18; G11C 16/0483; G11C 16/30
See application file for complete search history.

(56) References Cited

U.S. PATENT DOCUMENTS

| | | | | |
|---|---|---|---|---|
| 2013/0198451 A1* | 8/2013 | Hyun | ................ | G06F 3/0652 |
| | | | | 711/155 |
| 2023/0154542 A1* | 5/2023 | Park | ................ | G11C 16/16 |
| | | | | 365/185.29 |

FOREIGN PATENT DOCUMENTS

| | | |
|---|---|---|
| KR | 1020150116352 A | 10/2015 |
| KR | 1020200139042 A | 12/2020 |

\* cited by examiner

*Primary Examiner* — Xiaochun L Chen
(74) *Attorney, Agent, or Firm* — WILLIAM PARK & ASSOCIATES LTD.

(57) ABSTRACT

The present technology relates to a memory device and a method of operating the memory device. The memory device includes a memory block including a plurality of memory cells corresponding to a plurality of word line groups, a source line driver configured to apply an erase voltage to a source line of the memory block during an erase operation, a voltage generation circuit configured to apply an operation voltage increasing from a first operation voltage to a second operation voltage to the plurality of word line groups during the erase operation, and a control logic configured to control the source line driver and the voltage generation circuit to perform a suspend operation of stopping the erase operation.

28 Claims, 12 Drawing Sheets

FIG. 7

```
START
  ↓
PERFORM ERASE OPERATION — S710
  ↓
PERFORM SUSPEND OPERATION — S720
  ↓
DETERMINE TIME POINT OF SUSPEND OPERATION — S730
  ↓
SET NUMBER OF REMAINING ERASE PULSES BASED ON TIME POINT OF SUSPEND OPERATION — S740
  ↓
RESUME ERASE OPERATION BY PERFORMING RESUME OPERATION, APPLY SET NUMBER OF REMAINING ERASE PULSES, AND RISE WORD LINE OPERATION VOLTAGE AT SET TIME POINT — S750
  ↓
END
```

FIG. 8

| TIME POINT OF SUSPEND OPERATION | ERASE CHARACTERISTIC | SUBTRACTION NUMBER ADJUSTMENT RATIO |
|---|---|---|
| FIRST PERIOD | normal | – |
| SECOND PERIOD | Deep ERS | 1:1 |
| THIRD PERIOD | Shallow ERS | 4:1 |
| FOURTH PERIOD | Deep ERS | 1:1 |
| FIFTH PERIOD | normal | 1:1 |
| SIXTH PERIOD | Shallow ERS | 4:1 |

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2022-0078879, filed on Jun. 28, 2022, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

Among semiconductor devices, in particular, a memory device is largely divided into a volatile memory device and a nonvolatile memory device.

A write speed and a read speed of the nonvolatile memory devices are relatively slow, but the nonvolatile memory devices maintain storage data even though a power supply may be cut off. Therefore, the nonvolatile memory devices are used to store data to be maintained regardless of whether power is supplied. The nonvolatile memory devices include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

The flash memory has an advantage of a RAM that may freely program and erase data and an advantage of a ROM that may preserve stored data even though power supply is cut off. The flash memory is widely used as a storage medium of a portable electronic device such as a digital camera, a personal digital assistant (PDA), and an MP3 player.

SUMMARY

According to an embodiment of the present disclosure, a memory device may include a memory block including a plurality of memory cells corresponding to a plurality of word line groups, a source line driver configured to apply an erase voltage to a source line of the memory block during an erase operation, a voltage generation circuit configured to apply an operation voltage increasing from a first operation voltage to a second operation voltage to the plurality of word line groups during the erase operation, and a control logic configured to control the source line driver and the voltage generation circuit to perform a suspend operation of stopping the erase operation in response to a suspend command, and configured to set the number of remaining erase pulses of the erase operation and a rising time point when the operation voltage increases from the first operation voltage to the second operation voltage, based on the number of times the suspend operation is performed, for each of the plurality of word line groups.

According to an embodiment of the present disclosure, a method of operating a memory device may include performing an erase operation on a memory block including a plurality of memory cells corresponding to a plurality of word line groups, performing a suspend operation of stopping the erase operation in response to a suspend command received during the erase operation, setting the number of remaining erase pulses based on the number of times the suspend operation is performed during the erase operation, setting a rising time point of an operation voltage applied to the word lines of the selected memory block for each of the plurality of word line groups during the erase operation based on the number of times the suspend operation is performed and an adjustment ratio of each of the plurality of word line groups, and performing a resume operation of resuming the stopped erase operation, performing an erase pulse application loop as many times as the number of remaining erase pulses during the resume operation, and increasing the operation voltage applied to the word lines from a first operation voltage to a second operation voltage at the set rising time point of the operation voltage.

According to an embodiment of the present disclosure, a memory device may include a memory block including a plurality of memory cells corresponding to a plurality of word line groups, a source line driver configured to apply an erase voltage to a source line of the memory block during an erase operation, a voltage generation circuit configured to apply an operation voltage increasing from a first operation voltage to a second operation voltage to the plurality of word line groups during the erase operation, and a control logic configured to control the source line driver and the voltage generation circuit to perform a suspend operation of stopping the erase operation in response to a suspend command, and configured to set the number of remaining erase pulses of the erase operation for each of the plurality of word line groups based on a time point when the suspend operation is performed.

According to an embodiment of the present disclosure, a method of operating a memory device may include performing an erase operation on a memory block including a plurality of memory cells corresponding to a plurality of word line groups, performing a suspend operation of stopping the erase operation in response to a suspend command received during the erase operation, setting the number of remaining erase pulses based on a time point when the suspend operation performed during the erase operation is performed, and performing a resume operation of resuming the stopped erase operation, and performing an erase pulse application loop as many times as the set number of remaining erase pulses.

According to an embodiment of the present disclosure, a memory device may include a memory block including a plurality of memory cells corresponding to a plurality of word line groups, a source line driver configured to apply an erase voltage to a source line of the memory block during an erase operation, a voltage generation circuit configured to apply an operation voltage increasing from a first operation voltage to a second operation voltage to the plurality of word line groups during the erase operation, and a control logic configured to control the source line driver and the voltage generation circuit to perform a suspend operation of stopping the erase operation in response to a suspend command, and configured to set a rising time point when the operation voltage increases from the first operation voltage to the second operation voltage for each of the plurality of word line groups, based on a time point when the suspend operation is performed or the number of times the suspend operation is performed.

According to an embodiment of the present disclosure, a method of operating a memory device may include performing an erase operation on a memory block including a plurality of memory cells corresponding to a plurality of word line groups, performing a suspend operation of stopping the erase operation in response to a suspend command received during the erase operation, setting the number of remaining erase pulses based on the number of times the suspend operation is performed during the erase operation, setting a rising time point of an operation voltage applied to word lines of the selected memory block for each of the plurality of word line groups during the erase operation based on the time point when the suspend operation is performed or the number of times the suspend operation is performed, and performing a resume operation of resuming the stopped erase operation, performing an erase pulse application loop as many times as the number of remaining erase pulses during the resume operation, and increasing the operation voltage applied to the word lines from a first operation voltage to a second operation voltage at the set rising time point of the operation voltage.

BRIEF DESCRIPTION OF THE DRAWINGS

FIG. 7 is a flowchart illustrating a method of operating a memory device according to a second embodiment of the present disclosure.

FIG. 8 is a diagram illustrating an erase characteristic and a subtraction number adjustment ratio according to an operation period of the memory device according to the second embodiment of the present disclosure

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, the present disclosure is described in detail by describing a preferred embodiment of the present disclosure with reference to the accompanying drawings. Hereinafter, an embodiments of the present disclosure is described in detail with reference to the accompanying drawings.

An embodiment of the present disclosure provides a memory device and a method of operating the memory device capable of improving a threshold voltage distribution of memory cells during an erase operation of a memory device.

In an embodiment, a threshold voltage distribution of memory cells during an erase operation of a memory device may be improved.

Figure 1:
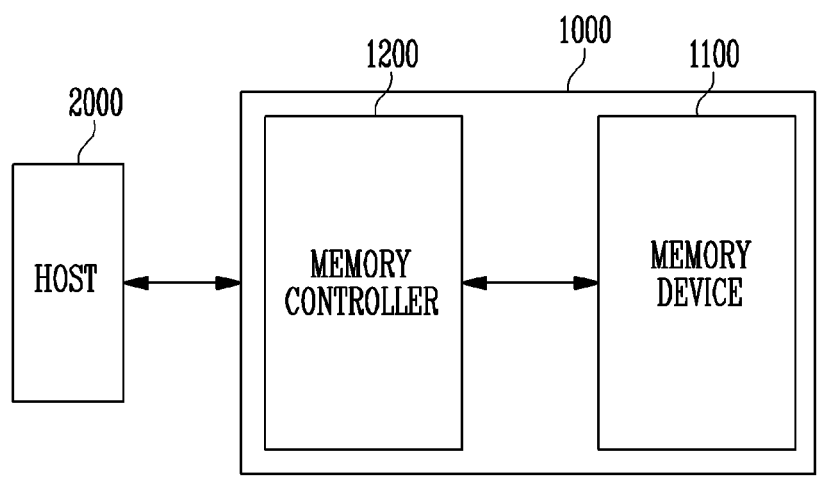
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 in which data is stored, and a memory controller 1200 that controls the memory device 1100 under control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA), or a serial attached SCSI (SAS). In addition, the interface protocols between the host 2000 and the memory system 1000 are not limited to the above-described examples, and may be one of other interface protocols such as a universal serial bus (USB), a multi-media card (MMC), an enhanced small disk interface (ESDI), or integrated drive electronics (IDE).

The memory controller 1200 may control an overall operation of the memory system 1000, and may control data exchange between the host 2000 and the memory device 1100. For example, the memory controller 1200 may program, read, or erase data by controlling the memory device 1100 according to a request of the host 2000. According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory device 1100 may perform a program, read, or erase operation under control of the memory controller 1200.

Figure 2:
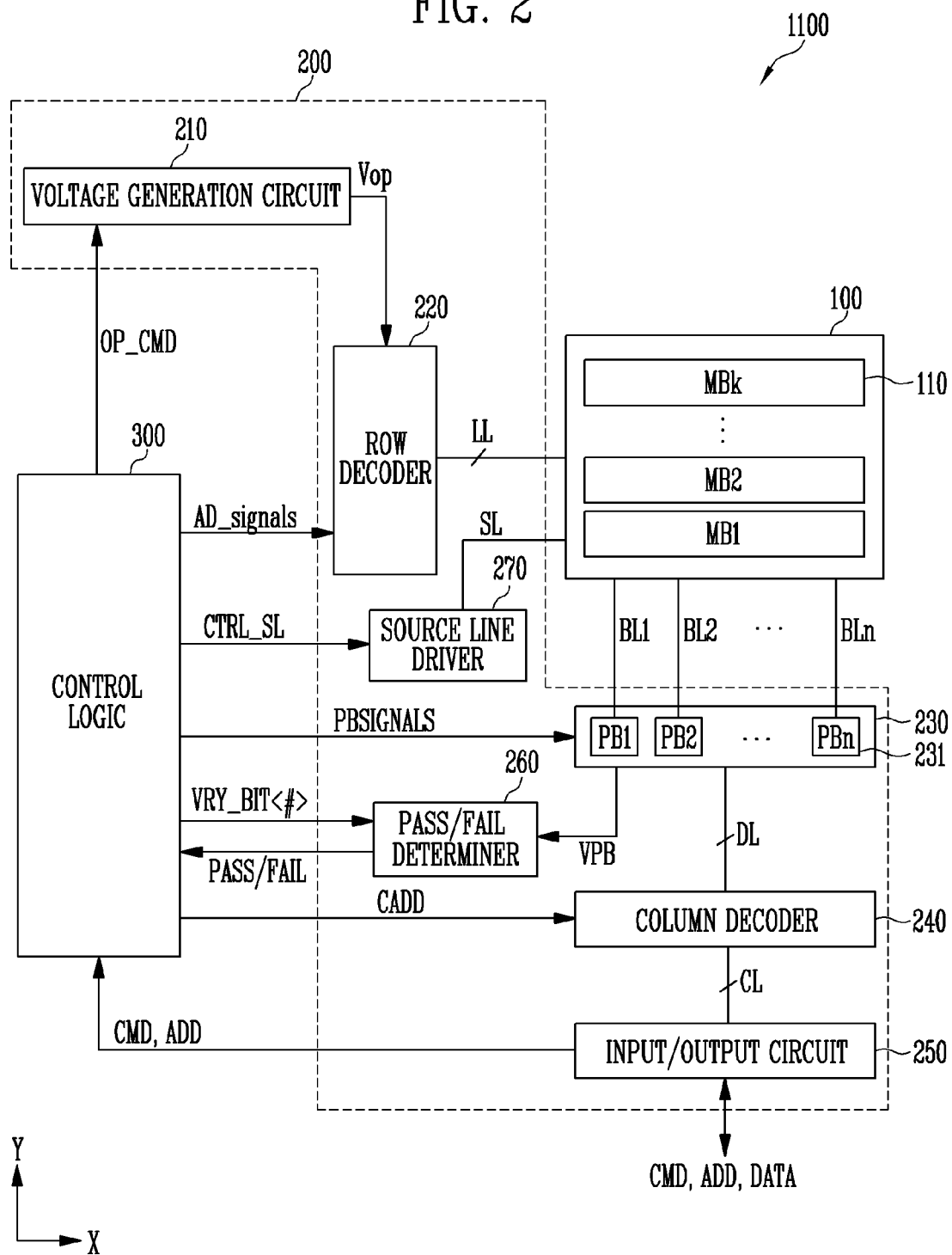
FIG. 2 is a diagram illustrating a memory device of FIG. 1.

FIG. 2 is a diagram illustrating the memory device of FIG. 1.

Referring to FIG. 2, the memory device 1100 may include the memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include control logic 300 that controls the peripheral circuits 200 according to the control of the memory controller 1200 of FIG. 1. The control logic 300 may be implemented as hardware, software, or a combination of hardware and software. For example, the control logic 300 may be a control logic circuit operating in accordance with an algorithm and/or a processor executing control logic code.

The memory cell array 100 may include a plurality of memory blocks MB1 to MBk; 110 (k is a positive integer). Local lines LL and bit lines BL1 to BLn (n is a positive integer) may be connected to each of the memory blocks MB1 to MBk; 110. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk; 110, respectively, and the bit lines BL1 to BLn may be commonly connected to the memory blocks MB1 to MBk; 110. The memory blocks MB1 to MBk; 110 may be implemented in a two-dimensional or three-dimensional structure. For example, the memory cells may be arranged in a direction parallel to a substrate in the memory block 110 of the two-dimensional structure. For example, the memory cells may be stacked in a direction perpendicular to the substrate in the memory block 110 of the three-dimensional structure.

The peripheral circuits 200 may be configured to perform the program, read, and erase operations of the selected memory block 110 under control of the control logic 300. For example, the peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. For example, the voltage generation circuit 210 may generate a program voltage, verify voltages, pass voltages, a turn-on voltage, a read voltage, first and second word line voltages, and the like under the control of the control logic 300.

The row decoder 220 may transmit the operation voltages Vop to the local lines LL connected to the selected memory block 110 in response to decoder control signals AD_signals. The row decoder 220 may be configured to be included in the voltage generation circuit 210.

The page buffer group 230 may include a plurality of page buffers PB1 to PBn; 231 connected to the bit lines BL1 to BLn. The page buffers PB1 to PBn; 231 may operate in response to page buffer control signals PBSIGNALS. For example, the page buffers PB1 to PBn; 231 may store data received through the bit lines BL1 to BLn or sense a voltage or a current of the bit lines BL1 to BLn during a read or verify operation.

The column decoder 240 may transmit data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transmit a command CMD and an address ADD received from the memory controller 1200 of FIG. 1 to the control logic 300 or may exchange the data DATA with the column decoder 240.

During the read operation or the verify operation, the pass/fail determiner 260 may generate a reference current in response to an allowable bit VRY_BIT<#>, compare a sensing voltage VPB received from the page buffer group 230 with a reference voltage generated by the reference current, and output a pass signal PASS or a fail signal FAIL.

The source line driver 270 may be connected to the memory cell included in the memory cell array 100 through a source line SL and may control a voltage applied to the source line SL. For example, during the program, read, or verify operation, the source line driver 270 may electrically connect the source line and a ground node. In addition, during the erase operation, the source line driver 270 may apply the erase voltage to the source line SL. The source line driver 270 may receive a source line control signal CTRL_SL from the control logic 300, and may connect the ground node to the source line or apply the erase voltage to the source line based on the source line control signal CTRL_SL.

The control logic 300 may output the operation signal OP_CMD, the row decoder control signals AD_signals, the page buffer control signals PBSIGNALS, and the allowable bit VRY_BIT<#> in response to the command CMD and the address ADD and control the peripheral circuits 200. In addition, the control logic 300 may determine whether the verify operation is passed or failed in response to the pass signal PASS or the fail signal FAIL.

When a suspend command is received from the memory controller 1200 of FIG. 1 during the erase operation of the memory device 1100, the control logic 300 may perform a suspend operation of stopping a currently performed erase operation. Thereafter, the control logic 300 may perform a resume operation of resuming the stopped erase operation by receiving a resume command from the memory controller 1200 of FIG. 1.

During the resume operation, the control logic 300 may set the number of remaining erase pulses of the erase operation, and set a rising time point of a word line operation voltage applied to the word lines, based on the number of suspend operations performed during the current erase operation. For example, the control logic 300 may set the number of remaining erase pulses by subtracting the number corresponding to the number of suspend operations from the number of erase pulse application loops which are not performed during the current erase operation. For example, the control logic 300 may calculate a shortened period based on the number of suspend operations and an adjustment ratio, and reset the initially set rising time point of the word line operation voltage by advancing the rising time point by the calculated shortened period. The shortened period may be equal to or shorter than a period corresponding to the number of subtractions. The control logic 300 may control the peripheral circuits 200 to perform the erase operation according to the set number of remaining erase pulses and rising time point.

The control logic 300 may set the number of remaining erase pulses of the erase operation based on a time point of the suspend operation performed immediately before the resume operation. For example, the control logic 300 may determine a period in which the immediately before performed suspend operation is performed among a plurality of periods of the erase operation, calculate the number of subtractions based on an adjustment ratio corresponding to the determined period and the number of suspend operations, and subtract the calculated number of subtractions from the number of erase pulse application loops which are not performed, to set the number of remaining erase pulses. The number of subtractions may be equal to or less than the number of suspend operations. For example, the erase operation may include a plurality of periods, and the plurality of periods may have different erase characteristics. For example, a partial period among the plurality of periods may have a shallow erase characteristic in which data is erased in a state where the threshold voltage is higher than a target threshold voltage. When the suspend operation is performed in the period corresponding to the shallow erase characteristic, the control logic 300 may adjust the number of suspend operations again to a relatively high adjustment ratio and calculate the number of subtractions less than the number of suspend operations to set the number of remaining erase pulses. The control logic 300 may control the peripheral circuits 200 to perform the erase operation according to the set number of remaining erase pulses.

During the resume operation, the control logic 300 may adjust the initially set rising time point of the word line operation voltage based on the number of suspend operations performed during the current erase operation or the time point when the immediately before performed suspend operation is performed. For example, based on the number of suspend operations, it may be determined whether the current erase operation has a deep erase characteristic in which the data is erased in a state where the threshold voltage of the memory cells is lower than the target threshold voltage or the shallow erase characteristic in which the data is erased in a state where the threshold voltage of the memory cells is higher than the target threshold voltage, and the initially set rising time point of the word line operation voltage may be advanced or delayed according to the determined erase characteristic, to reset the rising time point. In addition, the period in which the immediately before performed suspend operation is performed among the plurality of periods of the erase operation may be performed, and the initially set rising time point of the word line operation voltage may be advanced or delayed according to the erase characteristic corresponding to the determined period, to reset the rising time point. The control logic 300 may control the peripheral circuits 200 to perform the erase operation according to the set rising time point of the word line operation voltage.

Figure 3:
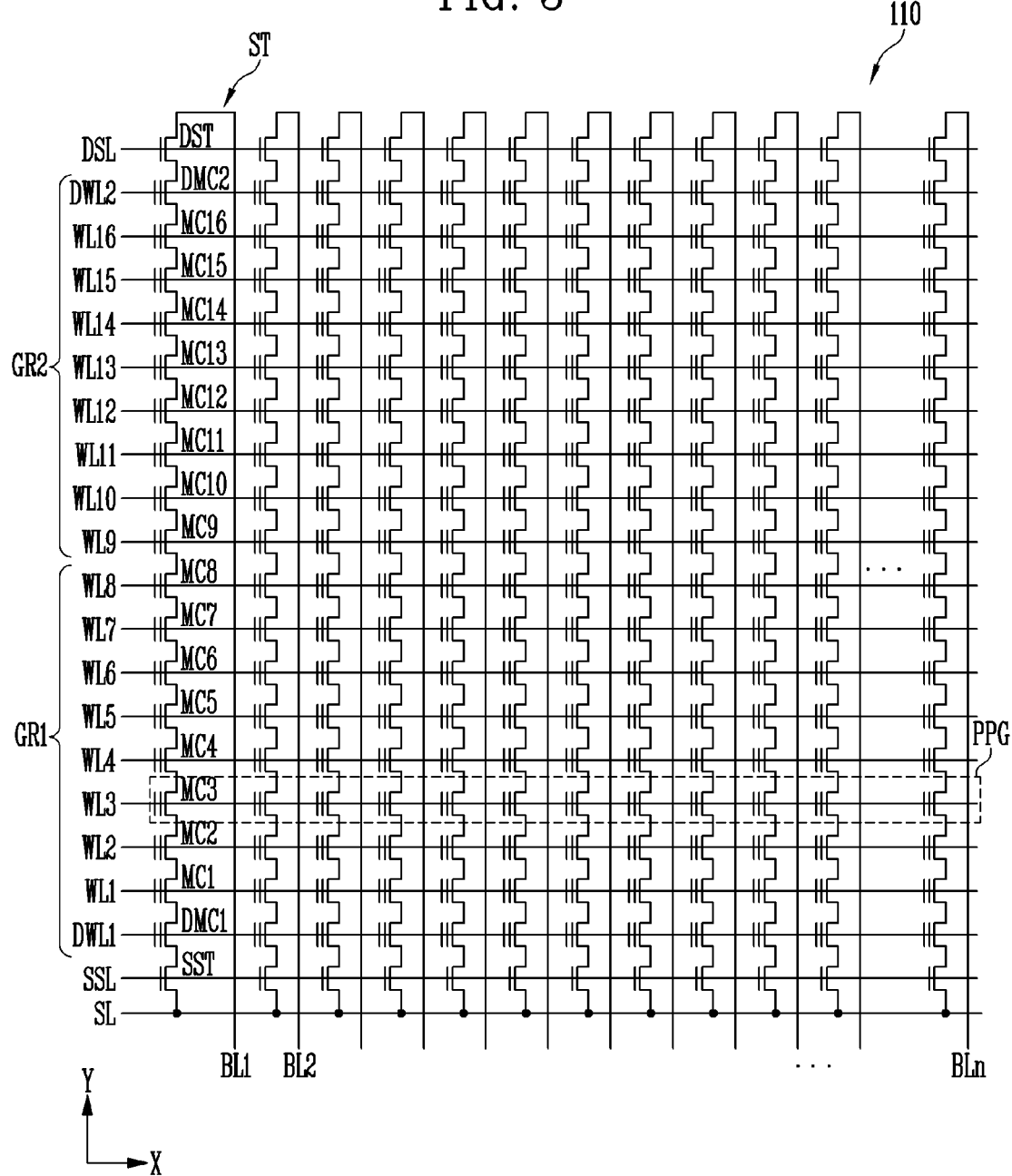
FIG. 3 is a diagram illustrating a memory block of FIG. 2.

FIG. 3 is a diagram illustrating the memory block of FIG. 2.

Referring to FIG. 3, the memory block 110 may be connected to a plurality of word lines arranged in parallel with each other between the first select line and the second select line. Here, the first select line may be the source select line SSL, and the second select line may be the drain select line DSL. More specifically, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Since the strings ST may be configured to be identical to each other, a string ST connected to the first bit line BL1 will be specifically described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a physical page PPG. Therefore, the memory block 11 may include the physical pages PPG of the number of the word lines WL1 to WL16.

The plurality of word lines WL1 to WL16 may be divided into a plurality of word line groups GR1 and GR2. For example, among the plurality of memory cells MC1 to MC16 included in the memory block 110, word lines connected to memory cells of which an erase speed is relatively high during the erase operation may be defined as a first word line group GR1, and word lines connected to memory cells of which an erase speed is relatively slow may be defined as a second word line group GR2. For example, the word lines WL1 to WL8 connected to the memory cells MC1 to MC8 adjacent to the source select transistor SST may be defined as the first word line group GR1 and the word lines WL9 to WL16 connected to the memory cells MC9 to MC16 adjacent to the drain select transistor DST may be defined as the second word line group GR2.

At least one dummy memory cell DMC1 may be disposed between the source select transistor SST and the memory cell MC1, and at least one dummy memory cell DMC2 may be disposed between the drain select transistor DST and the memory cell MC16. Each of the dummy memory cell DMC1 and the dummy memory cell DMC2 may be included in the same word line group as memory cells adjacent to each other. For example, the dummy memory cell DMC1 may be included in the first word line group GR1, and the dummy memory cell DMC2 may be included in the second word line group GR2.

In addition, dummy memory cells (not shown) may be disposed between memory cells (for example, MC8 and MC9) disposed in a central area of the plurality of memory cells MC1 to MC16, and the dummy memory cells may be included in a word line group of adjacent memory cells.

One memory cell may store data of one bit. This is commonly referred to as a single level cell (SLC). In this case, one physical page PPG may store one logical page (LPG) data. One logical page (LPG) data may include data bits of the number of cells included in one physical page PPG. In addition, one memory cell may store data of two or more bits. This is commonly referred to as a multi-level cell (MLC). In this case, one physical page PPG may store data of two or more logical page (LPG).

Figure 4:
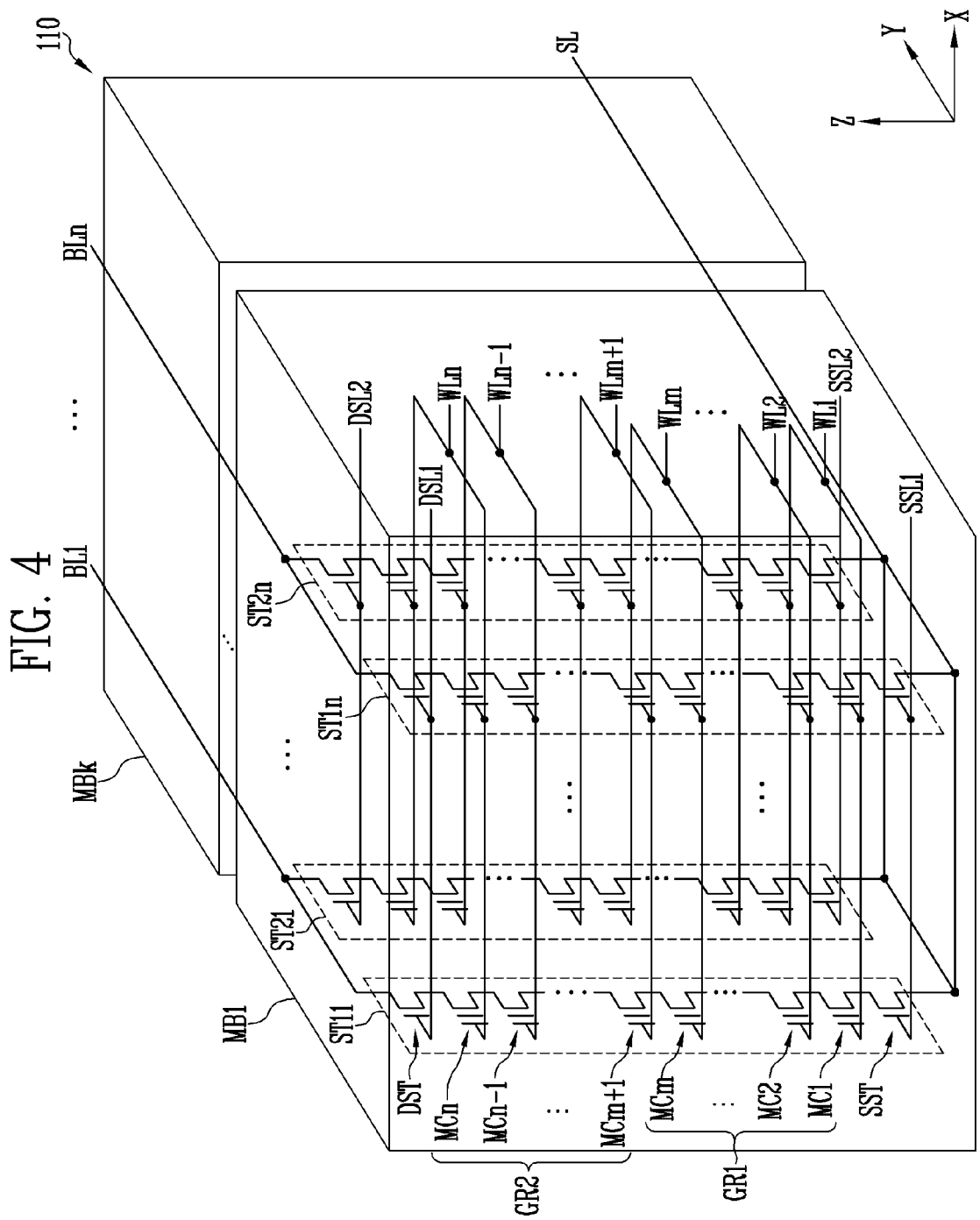
FIG. 4 is a diagram illustrating an embodiment of a three-dimensional memory block.

FIG. 4 is a diagram illustrating an embodiment of a three-dimensional memory block.

Referring to FIG. 4, the memory cell array 100 may include a plurality of memory blocks MB1 to MBk; 110. Each of the memory blocks 110 may include a plurality of strings ST11 to ST1n and ST21 to ST2n. Each of the plurality of strings ST11 to ST1n and ST21 to ST2n may extend along a vertical direction (Z direction). In the memory block 110, n strings may be arranged in a row direction (X direction). In FIG. 4, two strings are arranged in a column direction (Y direction), but this is for convenience of description, and three or more strings may be arranged in the column direction (Y direction).

Each of the plurality of strings ST11 to ST1n and ST21 to ST2n may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11 to ST1n arranged in the first row may be connected to a first source select line SSL1. The source select transistors of the strings ST21 to ST2n arranged in the second row may be connected to a second source select line SSL2. As another embodiment, the source select transistors of the strings ST11 to ST1n and ST21 to ST2n may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively. The first to n-th of word lines WL1 to WLn may be divided into a plurality of word line groups GR1 and GR2. For example, among the plurality of memory cells MC1 to MCn included in the memory block MB1, word lines connected to memory cells of which an erase speed is relatively high during the erase operation may be defined as a first word line group GR1, and word lines connected to memory cells of which an erase speed is relatively slow may be defined as a second word line group GR2. For example, word lines WL1 to WLm connected to memory cells MC1 to MCm adjacent to the source select transistor SST may be defined as the first word line group GR1 and word lines WLm+1 to WLm connected to memory cells MCm+1 to MCn adjacent to the drain select transistor DST may be defined as the second word line group GR2.

As an embodiment, at least one of the first to n-th memory cells MC1 to MCn may be used as a dummy memory cell. When the dummy memory cell is provided, a voltage or a current of a corresponding string may be stably controlled.

The drain select transistor DST of each string may be connected between the bit line and the memory cells MC1 to MCn. The drain select transistor DST of the strings arranged in the row direction may be connected to the drain select line extending in the row direction. The drain select transistors DST of the strings ST11 to ST1n of the first row may be connected to a first drain select line DSL1. The drain select transistors DST of the strings ST21 to ST2n of the second row may be connected to a second drain select line DSL2.

The plurality of memory blocks MB1 to MBk; 110 described with reference to FIG. 4 may share the source line SL.

Figure 5:
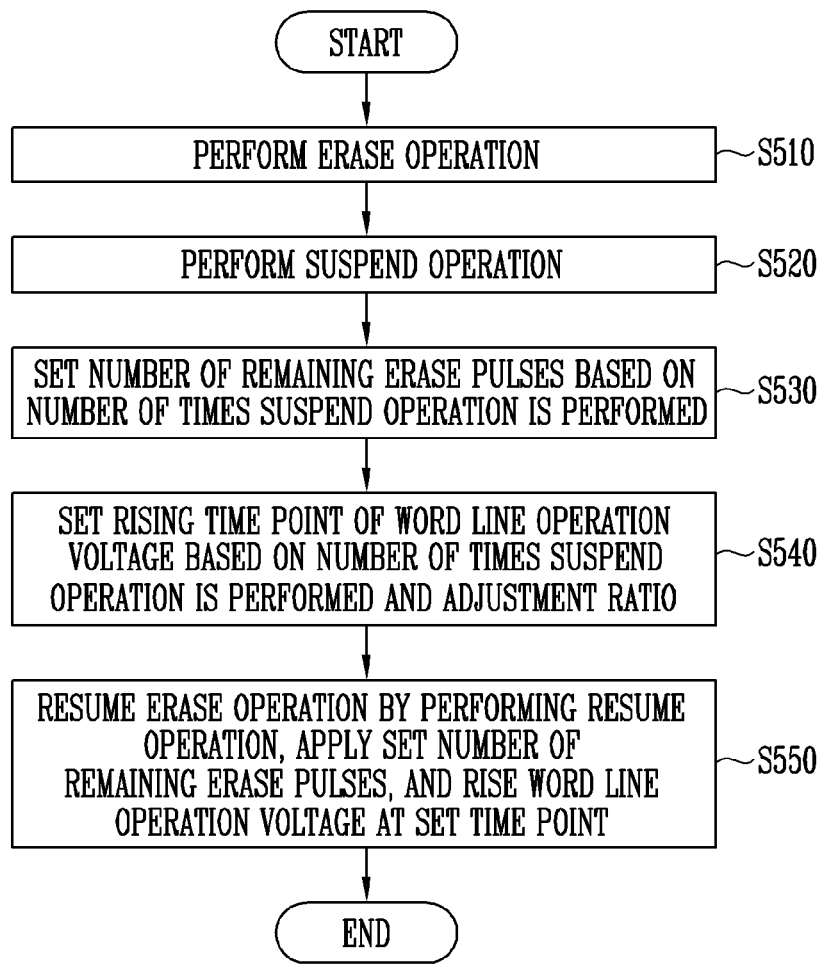
FIG. 5 is a flowchart illustrating a method of operating a memory device according to a first embodiment of the present disclosure.

FIG. 5 is a flowchart illustrating a method of operating a memory device according to a first embodiment of the present disclosure.

Figure 6:
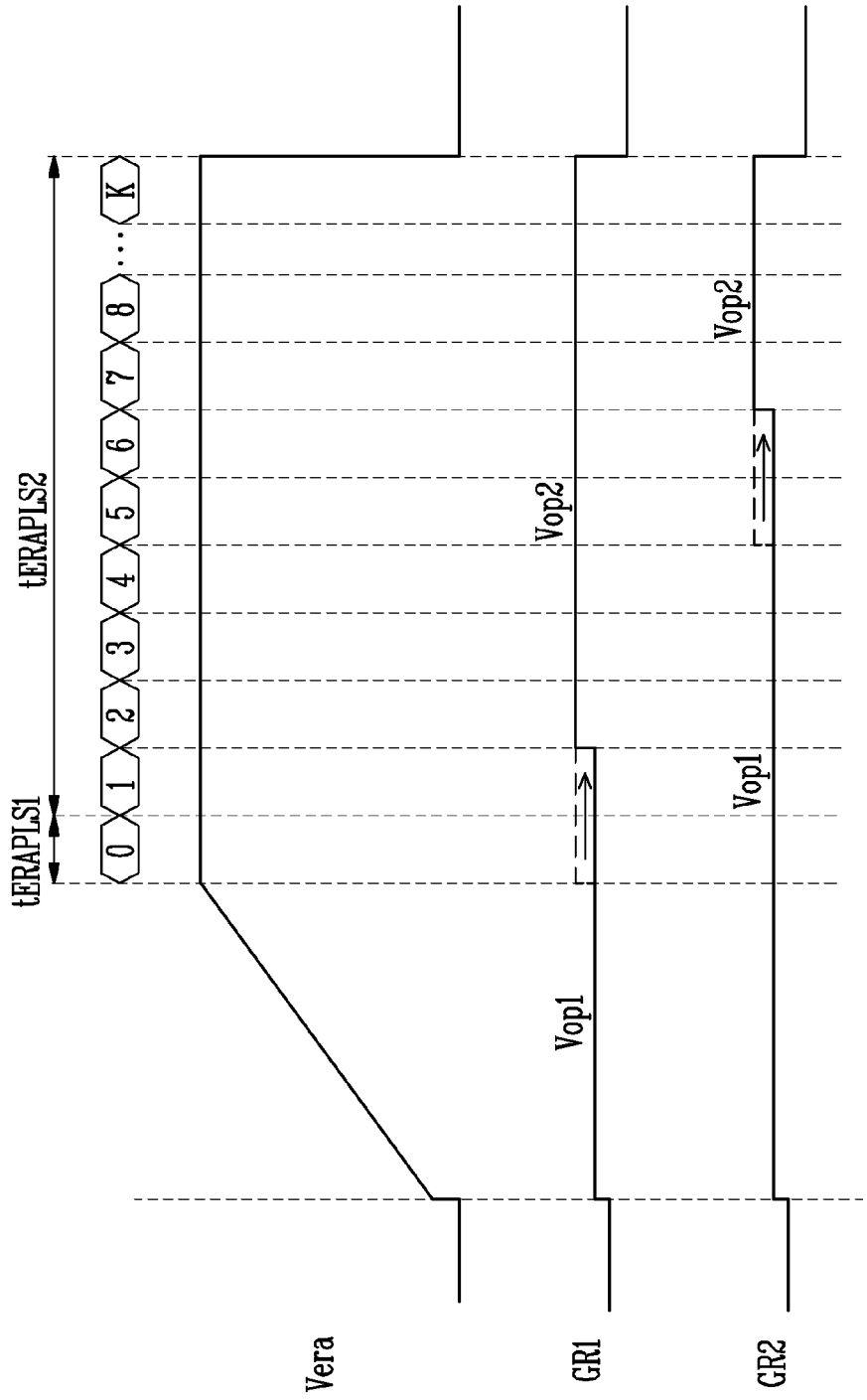
FIG. 6 is a waveform diagram of operation voltages illustrating an operation of the memory device according to the first embodiment of the present disclosure.

FIG. 6 is a waveform diagram of operation voltages illustrating an operation of the memory device according to the first embodiment of the present disclosure.

The method of operating the memory device according to the first embodiment of the present disclosure is described with reference to FIGS. 2 to 6 as follows.

In step S510, the erase operation is performed. The memory device 1100 receives the command CMD corresponding to the erase operation, and the control logic 300 controls the peripheral circuits 200 to perform the erase operation.

For example, during the erase operation, the source line driver 270 applies an erase voltage Vera to the source line SL connected to the selected memory block (for example, MB1). The erase voltage Vera may increase to a target level during a rising period, and then, the erase voltage Vera of the target level may be applied to the source line SL during erase pulse application operation periods tERAPLS1 and tERAPLS2. The erase pulse application operation periods tERAPLS1 and tERAPLS2 may include a first erase pulse application operation period tERAPLS1 including a first erase pulse application loop <0> and a second erase pulse application operation period tERAPLS2 including remaining erase pulse application loops <1:K>.

The voltage generation circuit 210 generates the operation voltage Vop to be applied to the word lines of the selected memory block MB1. The operation voltage Vop may include a first operation voltage Vop1 and a second operation voltage Vop2, and a potential of the second operation voltage Vop2 is higher than that of the first operation voltage Vop1. The first operation voltage Vop1 may have a potential higher than that of a ground voltage.

The row decoder 220 applies the operation voltage Vop generated by the voltage generation circuit 210 to the word lines of the selected memory block MB1. For example, the row decoder 220 may apply the first operation voltage Vop1 up to a set erase pulse application loop among the plurality of erase pulse application loops 0 to K sequentially performed in the erase pulse application operation periods tERAPLS1 and tERAPLS2, and apply the second operation voltage Vop2 to the word lines from a next erase pulse application loop. A time point when the operation voltage Vop is changed from the first operation voltage Vop1 to the second operation voltage Vop2 may be defined as a rising time point of the word line operation voltage. During the erase operation, the memory cells are erased by the erase voltage Vera applied to the source line SL and the first operation voltage Vop1 or the second operation voltage Vop2 applied to the word lines, and an erase speed in a period in which the first operation voltage Vop1 is applied is faster than an erase speed in a period in which the second operation voltage Vop2 is applied.

In step S520, the suspend operation is performed during the erase operation. The memory device 1100 may receive the command CMD corresponding to the suspend operation during the erase operation, and the control logic 300 stops the erase operation in response to the command CMD. Thereafter, the memory device 1100 may perform other overall operations.

In step S530, the control logic 300 sets the number of remaining erase pulses based on the number of suspend operations performed during the currently performed erase operation.

For example, the control logic 300 may set the number of remaining erase pulses by subtracting the number of times the suspend operation is performed from the number of erase pulse application loops which are not performed due to the suspend operation in the current erase operation.

For example, when the number of times the suspend operation is performed is 4 times, the control logic 300 may set the number of remaining erase pulses by subtracting 4 times from the number of erase pulse application loops which are not performed.

In step S540, the control logic 300 sets the rising time point of the word line operation voltage based on the number of times the suspend operation is performed and the adjustment ratio.

For example, the control logic 300 may calculate the shortened period based on the number of suspend operations and the adjustment ratio, and reset the initially set rising time point of the word line operation voltage by advancing the rising time point by the calculated shortened period. The shortened period may be equal to or shorter than the period corresponding to the number of erase pulse application loops subtracted in step S530 described above.

For example, when the number of times the suspend operation is performed is 4 times and the adjustment ratio is 1:1, the control logic 300 may set the shortened period as a period of 4 times of erase pulse application loops according to the subtracted number of erase pulse application loops (4 times) and the adjustment ratio.

For example, when the number of times the suspend operation is performed is 4 times and the adjustment ratio is 2:1, the control logic 300 may set the shortened period as a period of twice of erase pulse application loops according to the subtracted number of erase pulse application loops (4 times) and the adjustment ratio.

For example, when the number of times the suspend operation is performed is 4 times and the adjustment ratio is 4:1, the control logic 300 may set the shortened period as a period of once of erase pulse application loop according to the subtracted number of erase pulse application loops (4 times) and the adjustment ratio.

The above-described operation of setting the rising time point of the word line operation voltage may be performed for each of the plurality of word line groups GR1 and GR2. For example, an adjustment ratio of the word line group GR1 and an adjustment ratio of the word line group GR2 may be equal to or different from each other.

Referring to FIG. 6, when the initially set rising time point of the word line operation voltage of the first word line group GR1 is an erase pulse application loop <4>, the number of times the suspend operation is performed is 4 times, and the adjustment ratio is 1:1, the first operation voltage Vop1 applied to the first word line group GR1 may be changed to the second operation voltage Vop2 in an erase pulse application loop <0> by a shortened period equal to the number of times the suspend operation is performed. That is, the rising time point of the word line operation voltage may be advanced by the number of times the suspend operation is performed from the erase pulse application loop <4>, which is the initially set rising time point of the word line operation voltage, and may be reset to the erase pulse application loop <0>. An erase speed of the memory cells connected to the second word line group GR2 may be slower than an erase speed of the memory cells connected to the first word line group GR1. Accordingly, the initially set rising time point of the word line operation voltage of the memory cells connected to the second word line group GR2 may be set to be later than the initially set rising time point of the word line operation voltage of the memory cells connected to the first word line group GR1. When the initially set rising time point of the word line operation voltage of the second word line group GR2 is an erase pulse application loop<9>, the number of times the suspend operation is performed is 4 times, and the adjustment ratio is 1:1, the first operation voltage Vop1 applied to the second word line group GR2 may be changed to the second operation voltage Vop2 in an erase pulse application loop <5> by the shortened period equal to the number of times the suspend operation is performed. That is, the rising time point of the word line operation voltage may be advanced by the number of times the suspend operation is performed from the erase pulse application loop <9>, which is the initially set rising time point of the word line operation voltage, and may be reset to the erase pulse application loop <5>. When the number of times the suspend operation is performed is increased, a time for applying erase pulses successively applied may be shortened, and thus the shallow erase characteristic of the memory cells may occur.

When the initially set rising time point of the word line operation voltage of the first word line group GR1 is the erase pulse application loop <4>, the number of times the suspend operation is performed is 4 times, and the adjustment ratio is 2:1, the shortened period is calculated as a period of twice of erase pulse application loops according to the number of times the suspend operation is performed and the adjustment ratio. The first operation voltage Vop1 applied to the first word line group GR1 may be changed to the second operation voltage Vop2 in an erase pulse application loop<2> by the calculated shortened period. That is, the rising time point of the word line operation voltage may be advanced by the shortened period calculated from the erase pulse application loop <4>, which is the initially set rising time point of the word line operation voltage, and may be reset to the erase pulse application loop <2>. When the initially set rising time point of the word line operation voltage of the second word line group GR2 is the erase pulse application loop <9>, the number of times the suspend operation is performed is 4 times, and the adjustment ratio is 2:1, the shortened period is calculated as a period of twice of erase pulse application loops according to the number of times the suspend operation is performed and the adjustment ratio. The first operation voltage Vop1 applied to the second word line group GR2 may be changed to the second operation voltage Vop2 in an erase pulse application loop <7> by the calculated shortened period. That is, the rising time point of the word line operation voltage may be advanced by the calculated shortened period from the erase pulse application loop <9>, which is the initially set rising time point of the word line operation voltage, and may be reset to the erase pulse application loop <7>.

As described above, the erase speed of the memory cells may be adjusted by adjusting the rising time point of the word line operation voltage by setting the adjustment ratio to be high.

In step S550, the resume operation is performed to resume the stopped erase operation. During the resume operation, the stopped erase operation is resumed according to the number of remaining erase pulses set in previous step S530 and the set rising time point of the word line operation voltage reset in step S540.

For example, the control logic 300 controls the source line driver 270 to sequentially proceed from the stopped erase pulse application loop and sequentially perform erase pulse application loops equal to the set number of remaining erase pulses.

In addition, the control logic 300 controls the voltage generation circuit 210 and the row decoder 220 to increase the first operation voltage Vop1, which is applied to the first and second word line groups GR1 and GR2, to the second operation voltage Vop2 and apply the second operation voltage Vop2 at the reset set rising time point of the word line operation voltage.

According to the above-described first embodiment of the present disclosure, the rising time point of the operation voltage applied to the word lines may be controlled based on the number of suspend operations and the adjustment ratio. That is, a time for which the first operation voltage Vop1 is applied may be increased, by controlling the shortened period of the rising time point of the operation voltage applied to the word lines to be relatively short compared to the number of times the suspend operation is performed. Accordingly, in an embodiment, the shallow erase characteristic in which data is erased in a state where the threshold voltage is higher than a target threshold voltage may be improved.

FIG. 7 is a flowchart illustrating a method of operating a memory device according to a second embodiment of the present disclosure.

FIG. 8 is a diagram illustrating an erase characteristic and a subtraction number adjustment ratio according to an operation period of the memory device according to the second embodiment of the present disclosure.

Figure 9:
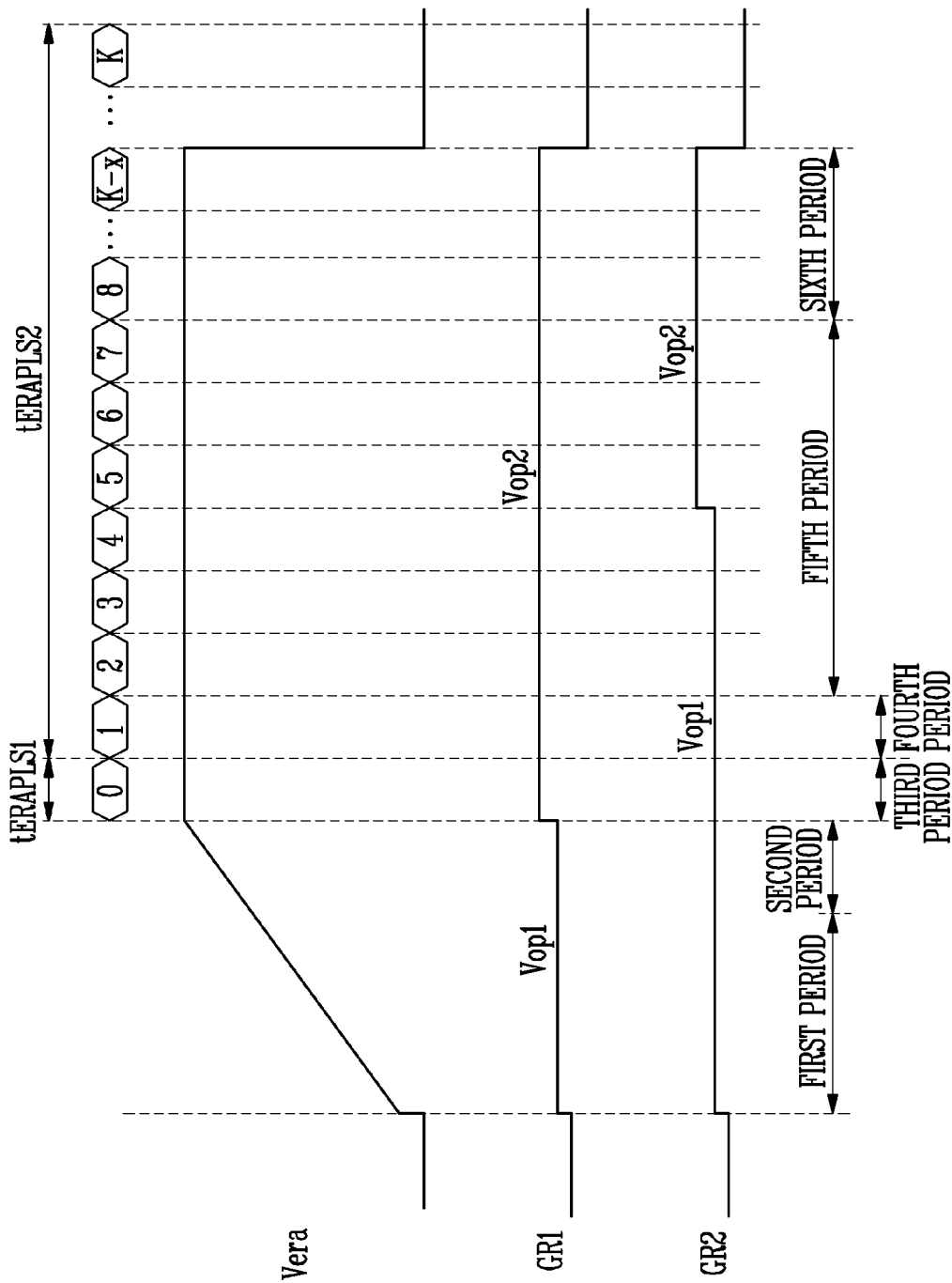
FIG. 9 is a waveform diagram of operation voltages illustrating an operation of the memory device according to the second embodiment of the present disclosure.

FIG. 9 is a waveform diagram of operation voltages illustrating an operation of the memory device according to the second embodiment of the present disclosure.

The operation of the memory device according to the second embodiment of the present disclosure is described with reference to FIGS. 2 to 4 and 7 to 9 as follows.

In step S710, the erase operation is performed. The memory device 1100 receives the command CMD corresponding to the erase operation, and the control logic 300 controls the peripheral circuits 200 to perform the erase operation.

For example, during the erase operation, the source line driver 270 applies an erase voltage Vera to the source line SL connected to the selected memory block (for example, MB1). The erase voltage Vera may gradually increase to a target level during a rising period, and then, the erase voltage Vera of the target level may be applied to the source line SL during erase pulse application operation periods tERAPLS1 and tERAPLS2. The erase pulse application operation periods tERAPLS1 and tERAPLS2 may include a first erase pulse application operation period tERAPLS1 including a first erase pulse application loop <0> and a second erase pulse application operation period tERAPLS2 including remaining erase pulse application loops <1:K>.

The voltage generation circuit 210 generates the operation voltage Vop to be applied to the word lines of the selected memory block MB1. The operation voltage Vop may include a first operation voltage Vop1 and a second operation voltage Vop2, and a potential of the second operation voltage Vop2 is higher than that of the first operation voltage Vop1. The first operation voltage Vop1 may have a potential higher than that of a ground voltage.

The row decoder 220 applies the operation voltage Vop generated by the voltage generation circuit 210 to the word lines of the selected memory block MB1. For example, the row decoder 220 may apply the first operation voltage Vop1 up to a set erase pulse application loop among the plurality of erase pulse application loops 0 to K sequentially performed in the erase pulse application operation periods tERAPLS1 and tERAPLS2, and apply the second operation voltage Vop2 to the word lines from a next erase pulse application loop. A time point when the operation voltage Vop is changed from the first operation voltage Vop1 to the second operation voltage Vop2 may be defined as a rising time point of the word line operation voltage. During the erase operation, the memory cells are erased by the erase voltage Vera applied to the source line SL and the first operation voltage Vop1 or the second operation voltage Vop2 applied to the word lines, and an erase speed in a period in which the first operation voltage Vop1 is applied is faster than an erase speed in a period in which the second operation voltage Vop2 is applied.

In step S720, the suspend operation is performed during the erase operation. The memory device 1100 may receive the command CMD corresponding to the suspend operation during the erase operation, and the control logic 300 stops the erase operation in response to the command CMD. Thereafter, the memory device 1100 may perform other overall operations.

In step S730, the time point of the suspend operation is determined.

Referring to FIG. 9, the erase operation may include a first period to a sixth period. The first period may be an initial period of the rising time point when the erase voltage increases, and the second period may be an end period of the rising period. The third period may be a time point when an initial erase pulse application loop among the plurality of erase pulse application loops is performed, that is, the first erase pulse application operation period tERAPLS1, and the fourth to sixth periods may be initial, intermediate, or end periods of the second erase pulse application operation period tERAPLS2.

Referring to FIG. 8, erase characteristics of each period may be different from each other. The first period is the initial period of the rising period in which the erase voltage Vera increases, and the erase operation is not substantially performed. Accordingly, even though the suspend operation is repeatedly performed in the first period, the memory cells may have a normal erase characteristic. The second period is a period in which the erase voltage Vera increases to a level adjacent to the target level. The second period is a period in which the number of remaining erase pulses is not subtracted even though the suspend operation is repeatedly performed because the erase pulse application loop is not performed. Accordingly, when the suspend operation is repeatedly performed in the second period, the memory cells may have a deep erase characteristic Deep ERS. When the suspend operation is performed in the third period, the memory cells may have a shallow erase characteristic Shallow ERS. This is because when the suspend operation and the resume operation are repeatedly performed in the initial erase pulse application loop <0>, the erase pulse application operation is repeated shortly and thus erase efficiency is reduced. Accordingly, the memory cells may have the shallow erase characteristic Shallow ERS. In each of the fourth to sixth periods, the memory cells may have the deep erase characteristic Deep ERS, a normal erase characteristic normal, and the shallow erase characteristic Shallow ERS. In a case of the fourth period, the number of erase pulse application loops subtracted based on the number of suspend operations may be similar to that of the third period, but the first erase pulse application operation period tERAPLS1 may be repeatedly performed, and thus the memory cells have the deep erase characteristic Deep ERS. In a case of the sixth period, when the suspend operation is performed less than a predetermined number of times (for example, 60 times), the memory cells may have the shallow erase characteristic Shallow ERS. The word "predetermined" as used herein with respect to a parameter, such as a predetermined number of times, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In step S740, the number of remaining erase pulses is set based on the determined time point when the suspend operation is performed.

For example, the control logic 300 calculates the number of subtractions based on the number of times the suspend operation is performed and the subtraction number adjustment ratio corresponding to the time point when the suspend operation is performed. In addition, the control logic 300 may set the number of remaining erase pulses by subtracting the calculated number of subtractions (x) from the number of erase pulse application loops which are not performed.

Accordingly, a total number of erase pulse application loops (K) of the second erase pulse application operation period tERAPLS2 may be subtracted by the calculated number of subtractions (x), and the erase operation may be ended in a last erase pulse application loop (K−x).

Referring to FIG. 8, a plurality of periods of the erase operation have different erase characteristics, and in the third period and the sixth period corresponding to the shallow erase characteristic among the plurality of periods, the subtraction number adjustment ratio is set higher than that of the remaining periods. Accordingly, when the suspend operation is performed in the third period and the sixth period corresponding to the shallow erase characteristic, a number of subtraction times smaller than the number of times the suspend operation is performed may be calculated.

For example, when the suspend operation is performed in the second period, the fourth period, and the fifth period, and the number of suspend operations performed during the erase operation is 60 times, the control logic 300 may set the number of remaining erase pulses by subtracting 60 times from the number of erase pulse application loops which are not performed. On the other hand, when the suspend operation is performed in the third period and the number of suspend operations performed during the erase operation is 60 times, the control logic 300 may set the number of remaining erase pulses by calculating the number of subtractions as 15 times based on the number of times the suspend operation is performed (60 times) and the subtraction number adjustment ratio (4:1), and subtracting the calculated number of subtractions (15 times) from the number of erase pulse application loops which are not performed. In addition, when the suspend operation is performed within the second erase pulse application operation period tERAPLS2 and the number of suspend operations performed during the erase operation is less than 60, for example, 20 times of suspend operations are performed, the control logic 300 may set the number of remaining erase pulses by calculating the number of subtractions as 5 times based on the number of times the suspend operation is performed (20 times) and the subtraction number adjustment ratio (4:1), and subtracting the calculated number of subtractions (5 times) from the number of erase pulse application loops which are not performed.

That is, when the suspend operation is performed in the period corresponding to the shallow erase characteristic, the number of remaining erase pulses may be set by calculating the number of subtractions to be less than the number of suspend operations.

In step S750, the resume operation is performed to resume the stopped erase operation. During the resume operation, the stopped erase operation is resumed according to the number of remaining erase pulses set in previous step S740 and the initially set rising time point of the word line operation voltage.

For example, the control logic 300 controls the source line driver 270 to sequentially proceed from the stopped erase pulse application loop and sequentially perform erase pulse application loops equal to the set number of remaining erase pulses.

In addition, the control logic 300 controls the voltage generation circuit 210 and the row decoder 220 to increase the first operation voltage Vop1, which is applied to the first and second word line groups GR1 and GR2, to the second operation voltage Vop2 and apply the second operation voltage Vop2 at the reset set rising time point of the word line operation voltage.

According to the second embodiment of the present disclosure described above, the number of remaining erase pulses may be set based on the number of suspend operations, the time point when the suspend operation is performed, and the subtraction number adjustment ratio corresponding thereto. That is, in an embodiment, when the suspend operation is performed in the period having the shallow erase characteristic, the number of remaining erase pulses may be set by subtracting the number of subtractions less than the number of suspend operations from the number of erase pulse application loops which are not performed, thereby improving a threshold voltage distribution.

The second embodiment of the present disclosure described above may be performed in parallel with the first embodiment of the present disclosure described above. That is, the stopped erase operation may be performing by controlling the rising time point of the operation voltage applied to the word lines based on the number of suspend operations and the adjustment ratio as in the first embodiment and setting the number of remaining erase pulses based on the number of suspend operations, the time point when the suspend operation is performed, and the subtraction number adjustment ratio corresponding thereto as in the second embodiment.

Figure 10:
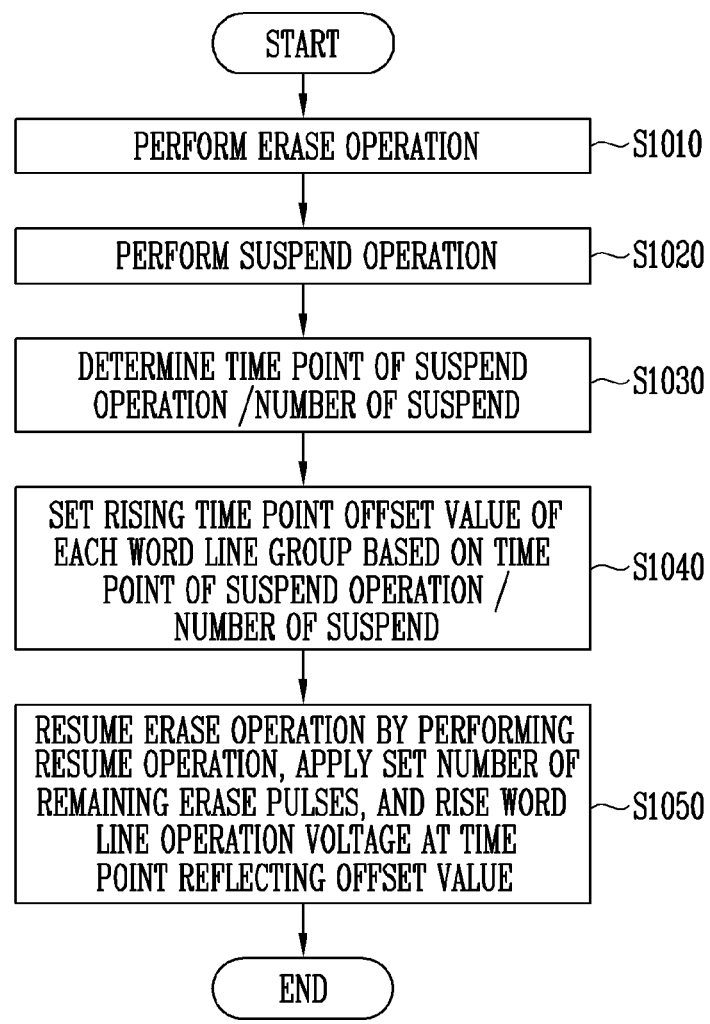
FIG. 10 is a flowchart illustrating a method of operating a memory device according to a third embodiment of the present disclosure.

FIG. 10 is a flowchart illustrating a method of operating a memory device according to a third embodiment of the present disclosure.

Figure 11:
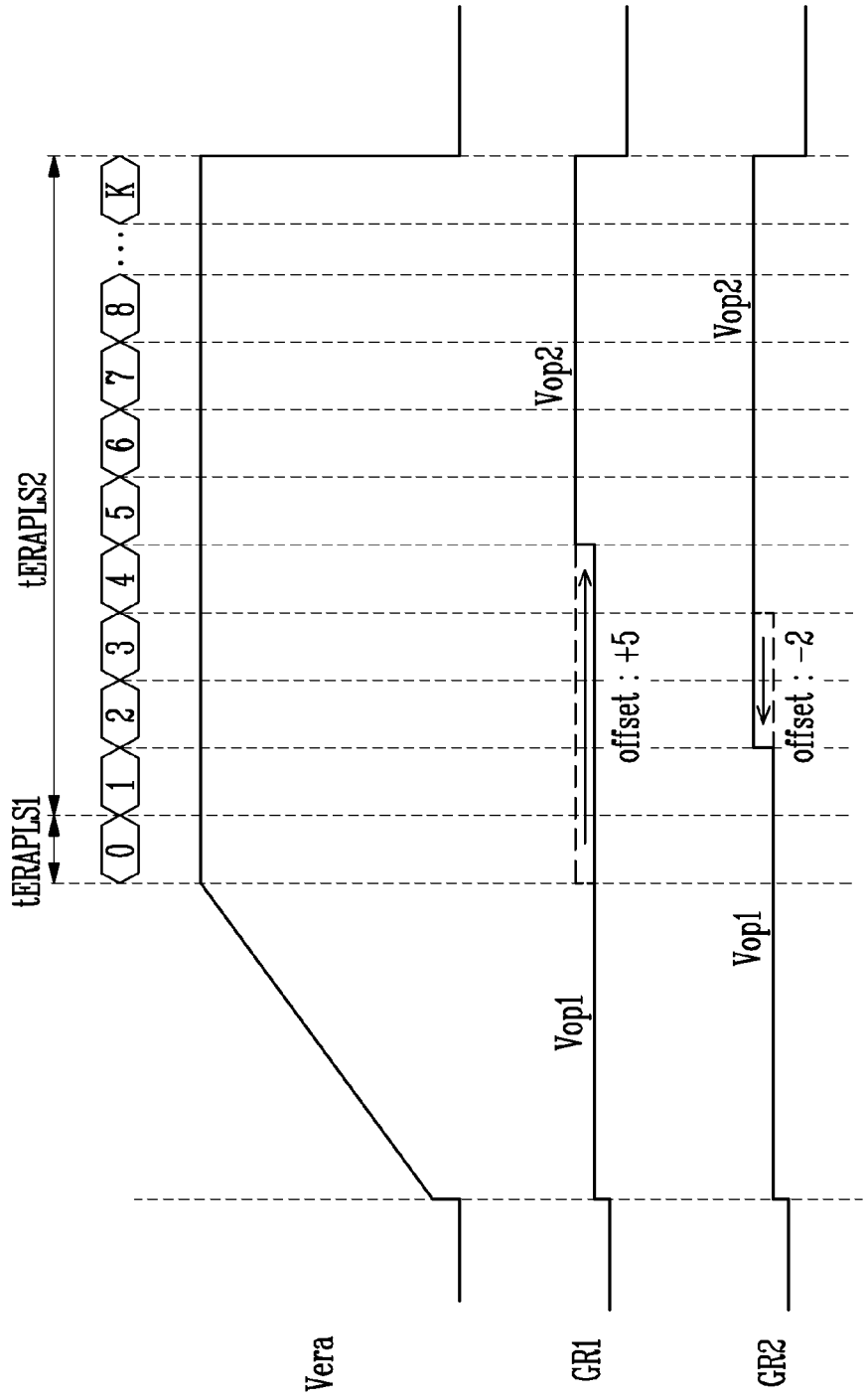
FIG. 11 is a waveform diagram of operation voltages illustrating a method of operating the memory device according to the third embodiment of the present disclosure.

FIG. 11 is a waveform diagram of operation voltages illustrating a method of operating the memory device according to the third embodiment of the present disclosure.

The third embodiment of the present disclosure is described with reference to FIGS. 1 to 4, 8, 10, and 11 as follows. In step S1010, the erase operation is performed. The memory device 1100 receives the command CMD corresponding to the erase operation, and the control logic 300 controls the peripheral circuits 200 to perform the erase operation.

For example, during the erase operation, the source line driver 270 applies an erase voltage Vera to the source line SL connected to the selected memory block (for example, MB1). The erase voltage Vera may gradually increase to a target level during a rising period, and then, the erase voltage Vera of the target level may be applied to the source line SL during erase pulse application operation periods tERAPLS1 and tERAPLS2. The erase pulse application operation periods tERAPLS1 and tERAPLS2 may include a first erase pulse application operation period tERAPLS1 including a first erase pulse application loop <0> and a second erase pulse application operation period tERAPLS2 including remaining erase pulse application loops <1:K>.

The voltage generation circuit 210 generates the operation voltage Vop to be applied to the word lines of the selected memory block MB1. The operation voltage Vop may include a first operation voltage Vop1 and a second operation voltage Vop2, and a potential of the second operation voltage Vop2 is higher than that of the first operation voltage Vop1. The first operation voltage Vop1 may have a potential higher than that of a ground voltage.

The row decoder 220 applies the operation voltage Vop generated by the voltage generation circuit 210 to the word lines of the selected memory block MB1. For example, the row decoder 220 may apply the first operation voltage Vop1 up to a set erase pulse application loop among the plurality of erase pulse application loops 0 to K sequentially performed in the erase pulse application operation periods tERAPLS1 and tERAPLS2, and apply the second operation voltage Vop2 to the word lines from a next erase pulse application loop. A time point when the operation voltage Vop is changed from the first operation voltage Vop1 to the second operation voltage Vop2 may be defined as a rising time point of the word line operation voltage. During the erase operation, the memory cells are erased by the erase voltage Vera applied to the source line SL and the first operation voltage Vop1 or the second operation voltage Vop2 applied to the word lines, and an erase speed in a period in which the first operation voltage Vop1 is applied is faster than an erase speed in a period in which the second operation voltage Vop2 is applied.

In step S1020, the suspend operation is performed during the erase operation. The memory device 1100 may receive the command CMD corresponding to the suspend operation during the erase operation, and the control logic 300 stops the erase operation in response to the command CMD. Thereafter, the memory device 1100 may perform other overall operations.

In step S1030, the time point of the suspend operation or the number of suspends is determined.

For example, the control logic 300 determines the time point of the immediately before performed suspend operation. For example, as shown in FIG. 8, the period in which the suspend operation is performed among the first to sixth periods is determined. In addition, the control logic 300 may count the number of times the suspend operation performed during the current erase operation is performed.

The control logic 300 may set the number of remaining erase pulses by subtracting the number of times the suspend operation is performed from the number of erase pulse application loops which are not performed due to the suspend operation in the current erase operation.

When the number of times the suspend operation is performed is 4 times, the control logic 300 may set the number of remaining erase pulses by subtracting 4 times from the number of erase pulse application loops which are not performed.

In step S1040, the offset value of the rising time point of each word line group is set based on the determined time point of the suspend operation or number of suspends.

For example, the control logic 300 may determine the erase characteristic of the memory cells corresponding to each of word line groups GR1 and GR2 based on the determined time point of the suspend operation or number of suspends. For example, when it is determined that the memory cells corresponding to the first word line group GR1 have the shallow erase characteristic based on the time point of the suspend operation or the number of suspends, the offset value of the first word line group GR1 may be set to a positive value (for example, +5). When the offset value has the positive value, the rising time point of the word line group may be delayed by the number of erase pulse application loops corresponding to the offset value. For example, when it is determined that the memory cells corresponding to the second word line group GR2 have the deep erase characteristic based on the time point of the suspend operation or the number of suspends, the offset value of the second word line group GR2 may be set to a negative value (for example, −2). When the offset value has the negative value, the rising time point of the word line group may be advanced by the number of erase pulse application loops corresponding to the offset value.

In step S1050, the resume operation is performed to resume the stopped erase operation.

The control logic 300 resets the rising time point of each word line group based on the offset value and resumes according to the number of remaining erase pulses set in previous step S1030 and the set rising time point of the word line operation voltage.

For example, the control logic 300 controls the source line driver 270 to sequentially proceed from the stopped erase pulse application loop and sequentially perform erase pulse application loops equal to the set number of remaining erase pulses.

In addition, the control logic 300 controls the voltage generation circuit 210 and the row decoder 220 to increase the first operation voltage Vop1, which is applied to the first and second word line groups GR1 and GR2, to the second operation voltage Vop2 and apply the second operation voltage Vop2 at the reset set rising time point of the word line operation voltage.

According to the third embodiment of the present disclosure described above, the rising time point of the operation voltage applied to the word lines may be controlled based on the time point of the suspend operation and the number of suspend operations. That is, based on the time point of the suspend operation and the number of suspend operations, the rising time point of the operation voltage may be set to be delayed in the word line group corresponding to the memory cells in which the shallow erase characteristic is likely to occur, and the rising time point of the operation voltage may be set to be advanced in the word line group corresponding to the memory cells in which the deep erase characteristic is likely to occur. Accordingly, in an embodiment, the threshold voltage distribution of the memory cells may be improved.

The third embodiment described above may be performed in parallel with the second embodiment described above. That is, the stopped erase operation may be performed by setting the number of remaining erase pulses based on the number of suspend operations, the time point when the suspend operation is performed, and the subtraction number adjustment ratio corresponding thereto as in the second embodiment and controlling the rising time point of the operation voltage applied to the word lines based on the time point of the suspend operation or the number of suspend operations as in the third embodiment.

Figure 12:
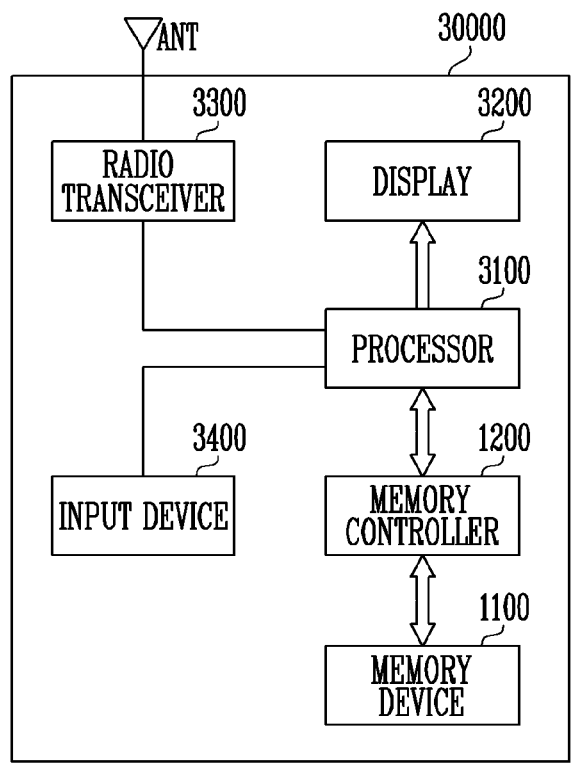
FIG. 12 is a diagram illustrating another embodiment of the memory system including the memory device shown in FIG. 2.

FIG. 12 is a diagram illustrating another embodiment of the memory system including the memory device shown in FIG. 2.

Referring to FIG. 12, the memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The memory controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100.

Figure 13:
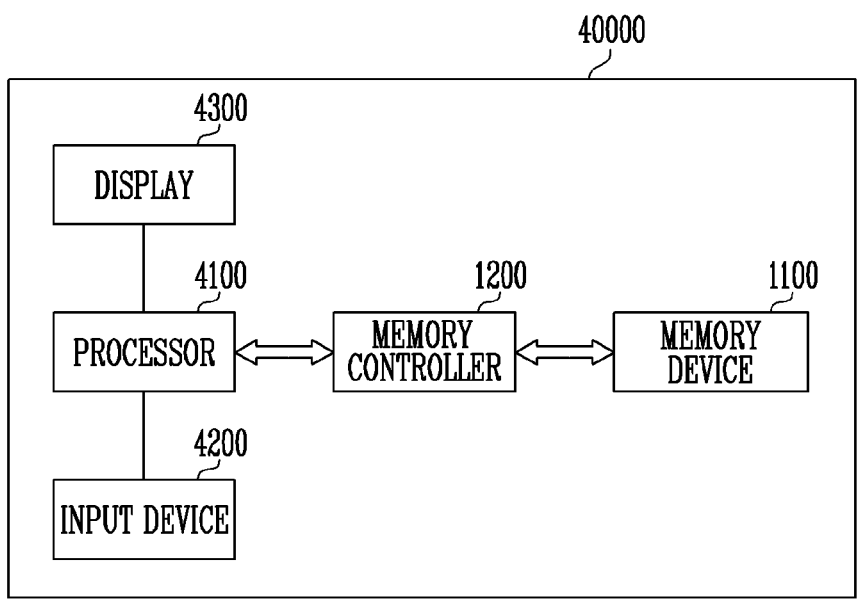
FIG. 13 is a diagram illustrating another embodiment of the memory system including the memory device shown in FIG. 2.

FIG. 13 is a diagram illustrating another embodiment of the memory system including the memory device shown in FIG. 2.

Referring to FIG. 13, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100.

Figure 14:
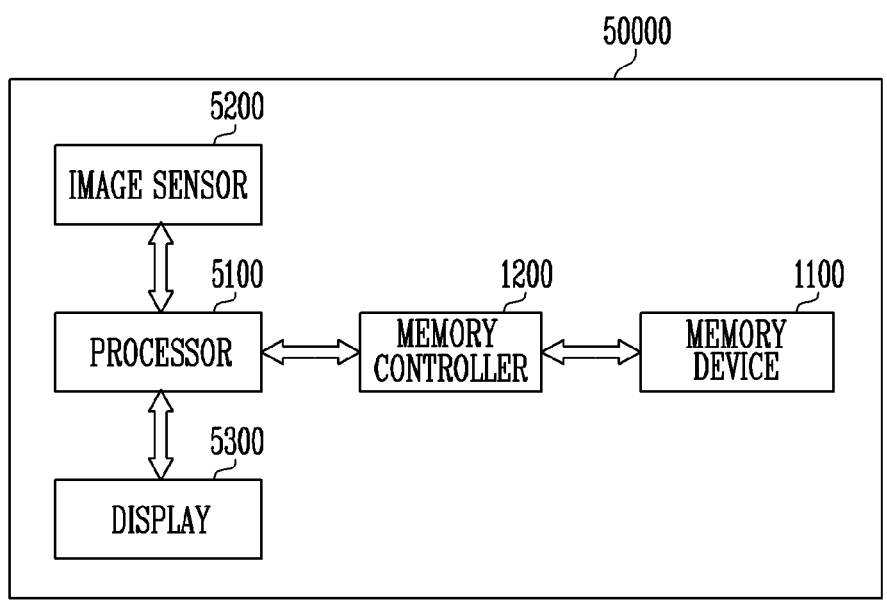
FIG. 14 is a diagram illustrating another embodiment of the memory system including the memory device shown in FIG. 2.

FIG. 14 is a diagram illustrating another embodiment of the memory system including the memory device shown in FIG. 2.

Referring to FIG. 14, the memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100.

Figure 15:
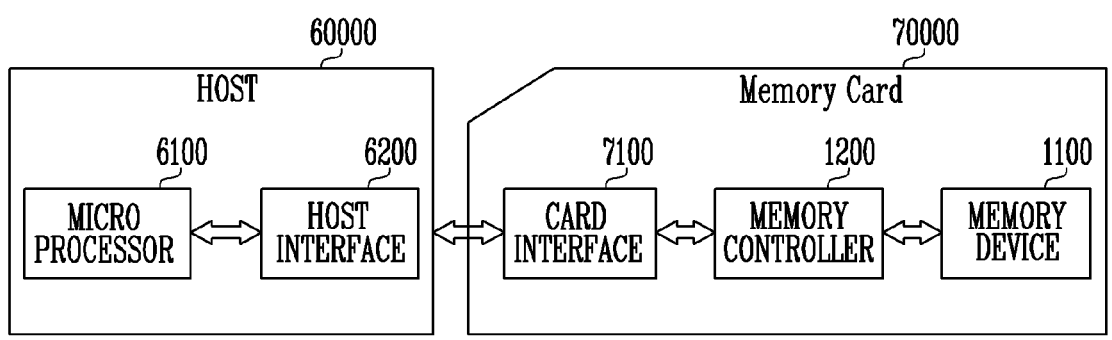
FIG. 15 is a diagram illustrating another embodiment of the memory system including the memory device shown in FIG. 2.

FIG. 15 is a diagram illustrating another embodiment of the memory system including the memory device shown in FIG. 2.

Referring to FIG. 15, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the memory controller 1200 under control of a microprocessor 6100.

What is claimed is:

1. A memory device comprising:
    a memory block including a plurality of memory cells corresponding to a plurality of word line groups;
    a source line driver configured to apply an erase voltage to a source line of the memory block during an erase operation;
    a voltage generation circuit configured to apply an operation voltage increasing from a first operation voltage to a second operation voltage to the plurality of word line groups during the erase operation; and
    a control logic configured to control the source line driver and the voltage generation circuit to perform a suspend operation of stopping the erase operation in response to a suspend command, and configured to set the number of remaining erase pulses of the erase operation and a rising time point when the operation voltage increases from the first operation voltage to the second operation voltage, based on the number of times the suspend operation is performed, for each of the plurality of word line groups.

2. The memory device of claim 1, wherein the control logic controls the source line driver and the voltage generation circuit to perform a resume operation of resuming the stopped erase operation after the suspend operation.

3. The memory device of claim 2, wherein the control logic sets the number of remaining erase pulses of the erase operation based on the number of times the suspend operation is performed during the erase operation, and controls the voltage generation circuit to perform an erase pulse application loop as many times as the number of remaining erase pulses during the resume operation.

4. The memory device of claim 3, wherein the control logic sets the number of remaining erase pulses by subtracting the number corresponding to the number of suspend operations from the number of erase pulse application loops which are not performed during the erase operation.

5. The memory device of claim 4, wherein the control logic calculates a shortened period of each of the plurality of word line groups based on the number of suspend operations and an adjustment ratio corresponding to each of the plurality of word line groups, and resets the rising time point of each of the plurality of word line groups by advancing the initially set rising time point of the word line operation voltage by the shortened period calculated for each of the plurality of word line groups.

6. The memory device of claim 5, wherein the shortened period is equal to or shorter than a period corresponding to the number of suspend operations.

7. A method of operating a memory device, the method comprising:
performing an erase operation on a memory block including a plurality of memory cells corresponding to a plurality of word line groups;
performing a suspend operation of stopping the erase operation in response to a suspend command received during the erase operation;
setting the number of remaining erase pulses based on the number of times the suspend operation is performed during the erase operation;
setting a rising time point of an operation voltage applied to the word lines of the selected memory block for each of the plurality of word line groups during the erase operation based on the number of times the suspend operation is performed and an adjustment ratio of each of the plurality of word line groups; and
performing a resume operation of resuming the stopped erase operation, performing an erase pulse application loop as many times as the number of remaining erase pulses during the resume operation, and increasing the operation voltage applied to the word lines from a first operation voltage to a second operation voltage at the set rising time point of the operation voltage.

8. The method of claim 7, wherein setting the number of remaining erase pulses comprises setting the number of remaining erase pulses by subtracting the number corresponding to the number of suspend operations from the number of erase pulse application loops which are not performed by the suspend operation during the erase operation.

9. The method of claim 8, wherein setting the rising time point of the operation voltage comprises:
calculating a shortened period corresponding to each of the plurality of word line groups based on the number of suspend operations and the adjustment ratio of each of the plurality of word line groups; and
resetting the initially set rising time point of the word line operation voltage by the calculated shortened period of each of the plurality of word line groups.

10. The method of claim 9, wherein the shortened period is equal to or shorter than a period corresponding to the number of suspend operations.

11. A memory device comprising:
a memory block including a plurality of memory cells corresponding to a plurality of word line groups;
a source line driver configured to apply an erase voltage to a source line of the memory block during an erase operation;
a voltage generation circuit configured to apply an operation voltage increasing from a first operation voltage to a second operation voltage to the plurality of word line groups during the erase operation; and
a control logic configured to control the source line driver and the voltage generation circuit to perform a suspend operation of stopping the erase operation in response to a suspend command, and configured to set the number of remaining erase pulses of the erase operation for each of the plurality of word line groups based on a time point when the suspend operation is performed,
wherein when the time point when the suspend operation is performed corresponds to a partial period, the control logic calculates the number of subtractions using an adjustment ratio corresponding to the partial period and the number of times the suspend operation is performed.

12. The memory device of claim 11, wherein the control logic controls the source line driver and the voltage generation circuit to perform a resume operation of resuming the stopped erase operation after the suspend operation.

13. The memory device of claim 12, wherein the control logic controls the voltage generation circuit to perform an erase pulse application loop as many times as the number of remaining erase pulses during the resume operation.

14. The memory device of claim 11, wherein the erase operation includes a plurality of periods, and the partial period among the plurality of periods is a period corresponding to a shallow erase characteristic.

15. The memory device of claim 11, wherein the control logic sets the number of remaining erase pulses by subtracting the calculated number of subtractions from the number of erase pulse application loops which are not performed by the suspend operation during the erase operation.

16. The memory device of claim 11, wherein the number of subtractions is equal to or less than the number of times the suspend operation is performed.

17. A method of operating a memory device, the method comprising:
performing an erase operation on a memory block including a plurality of memory cells corresponding to a plurality of word line groups;
performing a suspend operation of stopping the erase operation in response to a suspend command received during the erase operation;
setting the number of remaining erase pulses based on a time point when the suspend operation performed during the erase operation is performed; and
performing a resume operation of resuming the stopped erase operation, and performing an erase pulse application loop as many times as the set number of remaining erase pulses,
wherein setting the number of remaining erase pulses comprises:
calculating the number of subtractions using an adjustment ratio corresponding to a partial period and the number of times the suspend operation is performed, when the time point when the suspend operation is performed corresponds to the partial period; and setting the number of remaining erase pulses by subtracting the calculated number of subtractions from the number of erase pulse application loops which are not performed by the suspend operation during the erase operation.

18. The method of claim 17, wherein the erase operation includes a plurality of periods, and the partial period among the plurality of periods is a period corresponding to a shallow erase characteristic.

19. The method of claim 17, wherein the number of subtractions is equal to or less than the number of times the suspend operation is performed.

20. A memory device comprising:
a memory block including a plurality of memory cells corresponding to a plurality of word line groups;
a source line driver configured to apply an erase voltage to a source line of the memory block during an erase operation;
a voltage generation circuit configured to apply an operation voltage increasing from a first operation voltage to a second operation voltage to the plurality of word line groups during the erase operation; and
a control logic configured to control the source line driver and the voltage generation circuit to perform a suspend operation of stopping the erase operation in response to a suspend command, and configured to set a rising time point when the operation voltage increases from the first operation voltage to the second operation voltage for each of the plurality of word line groups, based on at least one of a time point when the suspend operation is performed or the number of times the suspend operation is performed.

21. The memory device of claim 20, wherein the control logic controls the source line driver and the voltage generation circuit to perform a resume operation of resuming the stopped erase operation after the suspend operation.

22. The memory device of claim 21, wherein the control logic sets the number of remaining erase pulses of the erase operation based on the number of times the suspend operation is performed during the erase operation, and controls the voltage generation circuit to perform an erase pulse application loop as many times as the number of remaining erase pulses during the resume operation.

23. The memory device of claim 22, wherein the control logic sets the number of remaining erase pulses by subtracting the number corresponding to the number of suspend operations from the number of erase pulse application loops which are not performed during the erase operation.

24. The memory device of claim 23, wherein the control logic determines an erase characteristic of each of the plurality of word line groups based on the time point when the suspend operation is performed or the number of times the suspend operation is performed, and sets an offset value of each of the plurality of word line groups according to the determined erase characteristic.

25. The memory device of claim 24, wherein the control logic resets an initially set rising time point by advancing or delaying the rising time point according to the offset value.

26. A method of operating a memory device, the method comprising:
performing an erase operation on a memory block including a plurality of memory cells corresponding to a plurality of word line groups;
performing a suspend operation of stopping the erase operation in response to a suspend command received during the erase operation;
setting the number of remaining erase pulses based on the number of times the suspend operation is performed during the erase operation;
setting a rising time point of an operation voltage applied to word lines of the selected memory block for each of the plurality of word line groups during the erase operation based on at least one of the time point when the suspend operation is performed or the number of times the suspend operation is performed; and
performing a resume operation of resuming the stopped erase operation, performing an erase pulse application loop as many times as the number of remaining erase pulses during the resume operation, and increasing the operation voltage applied to the word lines from a first operation voltage to a second operation voltage at the set rising time point of the operation voltage.

27. The method of claim 26, wherein setting the number of remaining erase pulses comprises setting the number of remaining erase pulses by subtracting the number corresponding to the number of suspend operations from the number of erase pulse application loops which are not performed by the suspend operation during the erase operation.

28. The method of claim 27, wherein setting the rising time point of the operation voltage comprises:
determining an erase characteristic of each of the plurality of word line groups based on at least one of the time point when the suspend operation is performed or the number of times the suspend operation is performed;
setting an offset value of each of the plurality of word line groups based on the determined erase characteristic; and
resetting the initially set rising time point of the operation voltage by advancing or delaying the rising time point according to the offset value.

* * * * *